United States Patent
Oh

(10) Patent No.: US 7,638,394 B2
(45) Date of Patent: Dec. 29, 2009

(54) METHOD FOR FABRICATING TRENCH MOSFET

(75) Inventor: Hee Sung Oh, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/987,864

(22) Filed: Dec. 5, 2007

(65) Prior Publication Data

US 2008/0138945 A1 Jun. 12, 2008

(30) Foreign Application Priority Data

Dec. 11, 2006 (KR) ............... 10-2006-0125894

(51) Int. Cl.
*H01L 29/76* (2006.01)

(52) U.S. Cl. ............... 438/268; 257/288; 257/E21.214; 257/E21.002

(58) Field of Classification Search ............... 438/142, 438/197, 199, 212, 268, 424, 400, 259, 270, 438/156, 206, 209; 257/213, 288, 412, E21.23, 257/E21.214, E21.002, 328, E21.41
See application file for complete search history.

(56) References Cited

U.S. PATENT DOCUMENTS 7,075,145 B2 * 7/2006 Williams et al. ............ 257/329
2005/0090068 A1 * 4/2005 Park ............................ 438/305
2006/0270149 A1 * 11/2006 Lee ............................. 438/243
2007/0259498 A1 * 11/2007 Chang et al. ................ 438/270

* cited by examiner

*Primary Examiner*—Matthew Smith
*Assistant Examiner*—Michele Fan
(74) *Attorney, Agent, or Firm*—Finnegan, Henderson, Farabow, Garrett & Dunner, L.L.P.

(57) ABSTRACT

A method for fabricating a semiconductor device, such as a trench MOSFET device, is provided. The method includes: forming a hard mask on an upper surface of a semiconductor substrate; forming an opening in the hard mask to expose a portion of the semiconductor substrate; forming a trench in the semiconductor substrate by etching the semiconductor substrate using the hard mask as an etch mask; forming a gate insulating film on inner walls of the trench; forming a conductive film on the gate insulating film and at least a portion of the hard mask, the conductive film filling the trench; forming a patterned conductive film in the trench by etching the conductive film; removing the hard mask; and forming a gate electrode by polishing the patterned conductive film until an upper surface of the patterned conductive film aligns with the upper surface of the semiconductor substrate.

10 Claims, 3 Drawing Sheets

METHOD FOR FABRICATING TRENCH MOSFET

RELATED APPLICATIONS

This Application claims the benefit of priority under 35 U.S.C. § 119 to Korean Patent Application No. 10-2006-0125894, filed Dec. 11, 2006, the entire contents of which are incorporated herein by reference.

BACKGROUND

The present invention relates to a method for fabricating a semiconductor device and, more particularly, to a method for fabricating a trench metal-oxide-semiconductor field effect transistor (MOSFET).

In general, a trench MOSFET includes a semiconductor substrate having a trench formed between a source and a drain of the trench MOSFET. The trench MOSFET includes a perpendicular channel due to the presence of the trench, thereby extending a gate between the source and the drain.

The trench described above is filled with a conducting material, such as polysilicon, so that a low current flow is possible in the trench MOSFET, thereby providing a low value of specific on-resistance.

After a thin insulating film, such as an oxide film, is formed on inner walls of the trench to form a gate insulating film, the polysilicon is deposited over the trench and a hard mask is formed on the semiconductor substrate. Then, the polysilicon fills in the trench and covers the oxide film.

Thereafter, the polysilicon is etched by means of an etch back process, which directly etches the polysilicon without using a photo resist film as an etch mask, so that a gate electrode formed of the polysilicon is formed in the trench. Here, in the etch back process of the polysilicon, an over-etching operation is performed. The over-etching operation further etches the polysilicon for some time even after the hard mask, which is used as an end point detection film, is exposed. At this time, the polysilicon remains only within the trench, and the gate electrode is formed. The gate electrode thus formed has an upper surface lower than that of the semiconductor substrate.

If the gate electrode does not fill the trench due to over-etching of the polysilicon, the capacitance of a gate may become smaller than a desired value. Consequently, there may be an insufficient amount of current flowing through the channel of the trench MOSFET.

In addition, since the upper surface of the polysilicon may be considerably damaged when the etch back process proceeds, the gate electrode formed in the trench must be thermal-processed for some time in a subsequent process.

SUMMARY

In one embodiment consistent with the present invention, there is provided a method for fabricating a semiconductor device. The method includes: forming a hard mask on an upper surface of a semiconductor substrate; forming an opening in the hard mask to expose a portion of the semiconductor substrate; forming a trench in the semiconductor substrate by etching the semiconductor substrate using the hard mask as an etch mask; forming a gate insulating film on inner walls of the trench; forming a conductive film on the gate insulating film and at least a portion of the hard mask, the conductive film filling the trench; forming a patterned conductive film in the trench by etching the conductive film; removing the hard mask; and forming a gate electrode by polishing the patterned conductive film until an upper surface of the patterned conductive film aligns with the upper surface of the semiconductor substrate.

In another embodiment consistent with the present invention, there is provided a method for fabricating a semiconductor device. The method includes: forming a hard mask on an upper surface of a semiconductor substrate; forming an opening in the hard mask to expose a portion of the semiconductor substrate; forming a trench in the semiconductor substrate by etching the semiconductor substrate using the hard mask as an etch mask; forming a gate insulating film on inner walls of the trench; forming a conductive film on the gate insulating film and at least a portion of the hard mask, the conductive film filling the trench; forming a patterned conductive film in the trench by etching the conductive film, the patterned conductive film having an upper surface lower than an upper surface of the hard mask; and forming a gate electrode inside the trench by polishing the hard mask and the patterned conductive film until the upper surface of the semiconductor substrate is exposed.

Other features consistent with the present invention will be, or will become, apparent to one skilled in the art upon examination of the accompanying drawings and the following detailed description.

DETAILED DESCRIPTION

Hereinafter, a fabricating method of a trench MOSFET device, according to embodiments consistent with the present invention will be described. However, the present invention is not limited thereto, and those skilled in the art will be able to implement the present invention in a variety of different manners without departing from the principles and spirit consistent with the present invention, the scope of which is defined in the claims and their equivalents.

Fabricating Method of MOSFET Device First Embodiment FIGS. 1 to 7 are cross-sectional views illustrating a fabricating method of a trench MOSFET device, according to a first embodiment consistent with the present invention.

Figure 1:
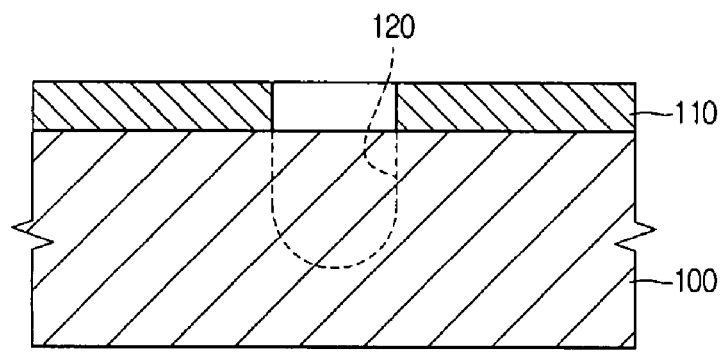
FIG. 1 is a cross-sectional view showing a hard mask formed on a semiconductor substrate, according to an embodiment consistent with the present invention.

FIG. 1 is a cross-sectional view showing a hard mask 110, according to an embodiment consistent with the present invention.

Referring to the FIG. 1, in order to fabricate a trench MOSFET device, a first oxide film (not shown) is first formed on an upper surface of a semiconductor substrate 100, and the first oxide film is patterned so that hard mask 110 is formed to expose a portion of semiconductor substrate 100, where a gate part 120 will be formed therein.

Specifically, in order to form hard mask 110, a photo resist film may be applied to the upper surface of the first oxide film, and a photo process comprising photography and development processes may be performed to pattern the photo resist film. Then, the photo resist film covers a remaining portion except for the portion where gate part 120 will be formed.

Thereafter, if the first oxide film is etched by using the patterned photo resist film as an etch mask, the first oxide film exposed by the patterned photo resist film is removed, so that hard mask 110 is formed to expose a portion of semiconductor substrate 100, in which gate part 120 will be formed.

Figure 2:
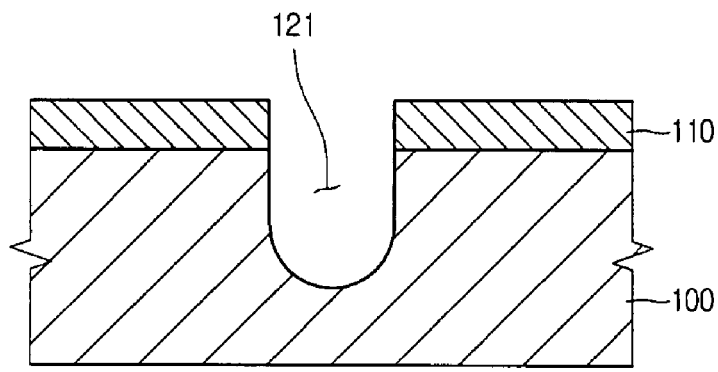
FIG. 2 is a cross-sectional view showing a trench formed in the semiconductor substrate, according to an embodiment consistent with the present invention.

FIG. 2 is a cross-sectional view showing a trench 121 in semiconductor substrate 100.

Referring to the FIG. 2, the portion of semiconductor substrate 100 exposed by hard mask 100, that is, the portion where gate part 120 will be formed, is etched by using hard mask 110 formed on semiconductor substrate 100 as an etch mask, thereby forming trench 121 having a predetermined depth.

Figure 3:
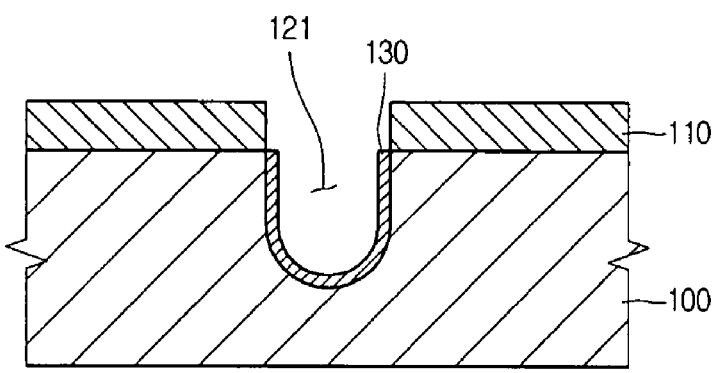
FIG. 3 is a cross-sectional view showing a second oxide film formed in the trench, according to an embodiment consistent with the present invention.

FIG. 3 is a cross-sectional view showing a gate insulating film 130 in trench 121.

Referring to the FIG. 3, after trench 121 is formed, a second oxide film is thinly formed on inner walls of trench 121, so as to form gate insulating film 130. In one embodiment, the second oxide film may be formed of the same material as hard mask 110. For example, hard mask 110 and the second oxide film may comprise silicon oxide. Here, the second oxide film can be formed by thermal-processing semiconductor substrate 100, in which trench 121 is formed. Then, the silicon oxide film is formed only on the inner walls of trench 121 formed of silicon. The silicon oxide film is not formed on the remaining area of trench 121 not formed of silicon.

Figure 4A:
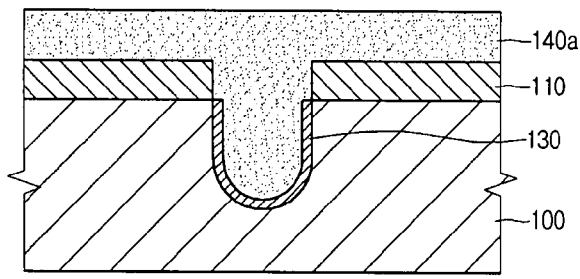
FIG. 4a is a cross-sectional view showing a conductive film formed in the trench and on an upper surface of the hard mask, according to an embodiment consistent with the present invention.
Figure 4B:
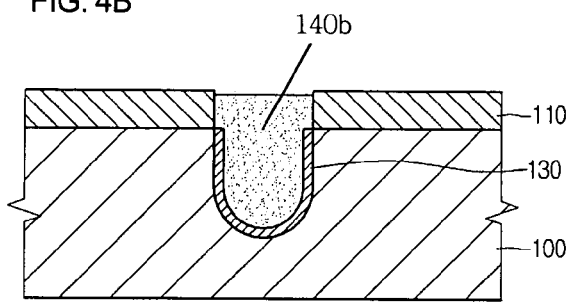
FIG. 4b is a cross-sectional view showing a patterned conductive film, according to an embodiment consistent with the present invention.

FIG. 4a is a cross-sectional view showing a polysilicon film 140a on semiconductor substrate 100 and in trench 121. FIG. 4b is a cross-sectional view showing the patterning of polysilicon film 140a.

Referring to the FIG. 4a, after gate insulating film 130 is formed on the inner walls of trench 121, a conductive film 140a, for example, a polysilicon film 140a, is formed in trench 121 and on hard mask 110. Polysilicon film 140a completely fills trench 120 and covers the upper surface of hard mask 110 at a predetermined thickness.

Thereafter, referring to the FIG. 4b, polysilicon film 140a is patterned and etched using an etch back process, such that polysilicon film 140a remains inside trench 121. Here, in order to uniformly etch polysilicon film 140a, an over-etching operation is performed to further etch polysilicon film 140a for some time even after the oxide material of hard mask 110, which is used as an end point detection film, is detected.

Due to the over-etching operation, a patterned polysilicon film 140b is formed in trench 121, patterned polysilicon film 140b having a top surface lower than that of hard mask 110.

Figure 5:
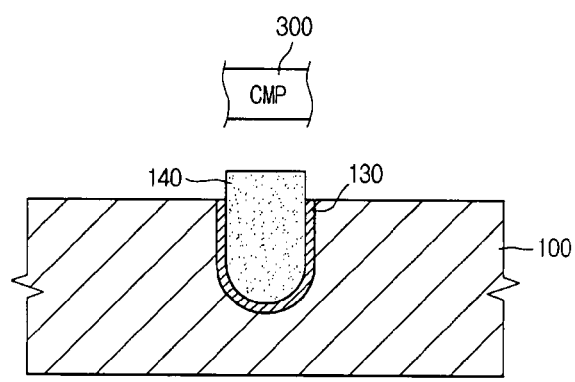
FIG. 5 is a cross-sectional view showing a state where the hard mask is removed, according to an embodiment consistent with the present invention.

FIG. 5 is a cross-sectional view showing that hard mask 110 shown in the FIG. 4b has been removed.

Referring to the FIG. 5, hard mask 110 is completely removed from semiconductor substrate 100 by using an etchant, the etching selectivity of which is higher than that used for etching polysilicon layer 140b.

If hard mask 110 is completely removed from semiconductor substrate 100 as described above, patterned polysilicon film 140b in trench 121 is projected from the upper surface of semiconductor substrate 100.

Figure 6:
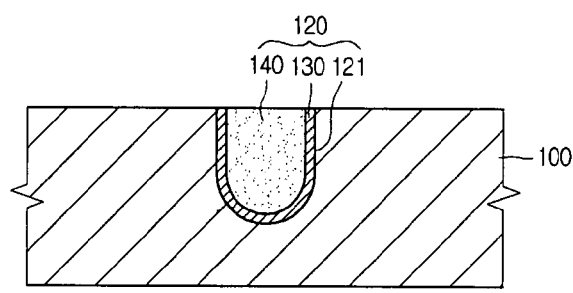
FIG. 6 is a cross-sectional view showing a gate electrode formed in the trench by polishing the patterned conductive film, according to an embodiment consistent with the present invention.

FIG. 6 is a cross-sectional view showing a gate electrode 140 in trench 121.

Referring to the FIG. 6, after removing hard mask 100, a portion of patterned polysilicon film 140b projected from the upper surface of semiconductor substrate 110 is removed by using a chemical-mechanical polishing (CMP) device 300 (shown in FIG. 5), patterned polysilicon film 140b being polished until an upper surface of patterned polysilicon 140b aligns with the upper surface of semiconductor substrate 100 to form a gate electrode 140 in trench 121.

If patterned polysilicon film 140b is removed by means of a chemical-mechanical polishing method as described above, it is not required to thermal-process patterned polysilicon film 140b after etch back, and gate electrode 140 is formed to have a thickness substantially the same as the depth of trench 121, so that the capacitance of the gate can always be maintained constant.

Figure 7:
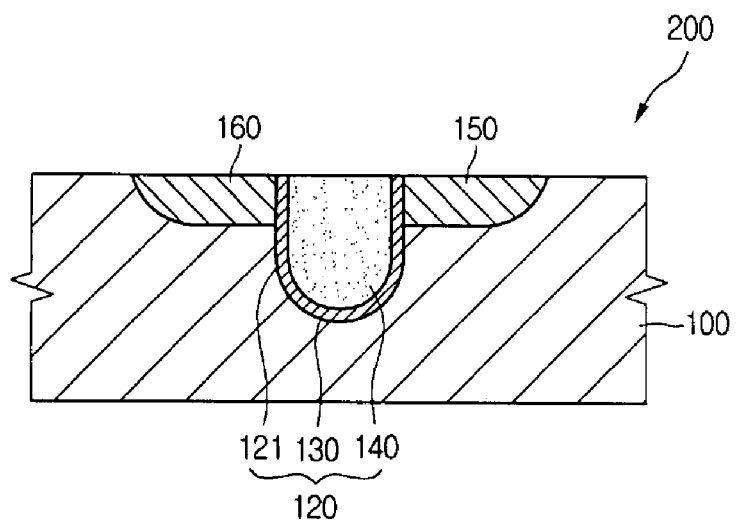
FIG. 7 is a cross-sectional view of a trench MOSFET device fabricated using a method, according to the first embodiment consistent with the present invention.

FIG. 7 is a cross-sectional view showing source and drain areas 150 and 160 on semiconductor substrate 100 at both sides of gate part 120.

Referring to the FIG. 7, after gate insulating film 130 and gate electrode 140 are formed inside trench 121, a source area 150 and a drain area 160 are formed on semiconductor substrate 100 at both sides of gate part 120 to fabricate trench MOSFET device 200.

Second Embodiment

Figure 8:
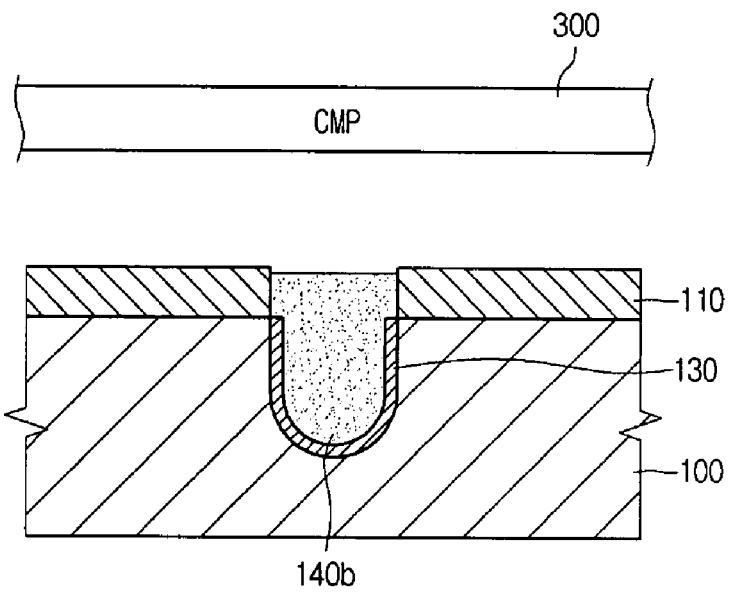
FIG. 8 is a cross-sectional view showing an alternative method step for removing the hard mask and polishing the patterned conductive film, according to the second embodiment consistent with the present invention.

FIG. 8 is a cross-sectional view illustrating an alternative step for removing hard mask 110 and polishing patterned polysilicon film 104b, according to a second embodiment consistent with the present invention.

The fabricating method of the trench MOSFET device according to the second embodiment is similar to the fabricating method according to the first embodiment except that hard mask 110 and patterned polysilicon film 140b projected from the upper surface of semiconductor substrate 100 are simultaneously removed by means of the chemical-mechanical polishing method. Accordingly, the second embodiment employs only one process step to remove hard mask 110 and patterned polysilicon film 140b projected from the upper surface of semiconductor substrate 100, which is different process from the first embodiment. Hereinafter, the removing process according to the second embodiment will be described in detail.

In order to fabricate trench MOSFET device 200, according to the second embodiment, a hard mask 110 is formed to expose only a portion of semiconductor substrate 100 where a gate part 120 (refer to FIG. 7) will be formed therein (refer to FIG. 2).

Thereafter, the portion of semiconductor substrate 100 exposed by hard mask 100 is etched by using hard mask 110 as an etch mask to form a trench 121 (refer to FIG. 3).

Thereafter, a second oxide film to be used as a gate insulating film is formed over the upper surface of hard mask 110 and on the inner walls of trench 121, so as to form gate insulating film 130 on the inner walls of trench 121 (refer to FIG. 4), and a polysilicon film 140*a* is formed over the upper surface of hard mask 110 and trench 121 (refer to FIG. 4*a*).

Subsequently, polysilicon film 140*a* is patterned and etched by using an etch back process, so that polysilicon film 140*a* remains only inside trench 121, thereby forming a patterned polysilicon film 140*b* (refer to FIG. 4*b*).

Thereafter, referring to FIG. 8, patterned polysilicon film 140*b* and hard mask 110 are polished by using a chemical-mechanical polishing device 300 until hard mask 110 is completely removed. Then, patterned polysilicon film 140*b* becomes the same height as the upper surface of semiconductor substrate 100 so that a gate electrode 140 is formed in trench 121.

If hard mask 110 and pattered polysilicon film 140 are removed by means of the chemical-mechanical polishing method as described above, a fabrication process is simplified as compared to the first embodiment, and gate electrode 140 is formed to have a thickness substantially the same as the depth of trench 121, so that the capacitance of the gate can always be maintained constant.

Source and drain areas 150 and 160 are formed on semiconductor substrate 100 at both sides of gate part 120 to complete the fabrication of trench MOSFET device 200 (refer to the FIGS. 7 and 8).

As described above, if the gate electrode is formed in the trench, and the gate electrode has a thickness substantially the same as the depth of the trench, the capacitance of the gate can always be maintained constant, so that the electrical properties of the trench MOSFET can be improved.

Embodiments described herein are intended to provide a general understanding of the principles consistent with the present invention. These embodiments are not intended to serve as a complete description of all possible modifications and enhancements consistent with the present invention. Many other embodiments may be apparent to those skilled in the art upon reviewing the disclosure. Other embodiments may be utilized and derived from the disclosure, such that structural and logical substitutions and changes may be made without departing from the scope of the appended claims. Additionally, the accompanying drawings are merely illustrative and may not be drawn to scale. Certain proportions within the illustrations may be exaggerated, while other proportions may be minimized. Accordingly, the detailed descriptions and the drawings are to be regarded as illustrative rather than restrictive. The appended claims and their equivalents are intended to cover all such modifications, enhancements, and other embodiments, which fall within the true spirit and scope consistent with the present invention.

What is claimed is:

1. A method for fabricating a semiconductor device, comprising:
    forming a hard mask on an upper surface of a semiconductor substrate;
    forming an opening in the hard mask to expose a portion of the semiconductor substrate;
    forming a trench in the semiconductor substrate by etching the semiconductor substrate using the hard mask as an etch mask;
    forming a gate insulating film on inner walls of the trench;
    forming a conductive film on the gate insulating film and at least a portion of the hard mask, the conductive film filling the trench;
    forming a patterned conductive film in the trench by etching the conductive film;
    removing the hard mask; and
    forming a gate electrode by polishing only the patterned conductive film until an upper surface of the patterned conductive film aligns with the upper surface of the semiconductor substrate.

2. The method of claim 1, wherein the gate electrode has a thickness substantially the same as the depth of the trench.

3. The method of claim 1, wherein forming the gate insulating film comprises thermal-processing the semiconductor substrate.

4. The method of claim 1, wherein the hard mask and the gate insulating film comprise oxide films.

5. The method of claim 1, wherein forming the patterned conductive film in the trench comprises forming the patterned conductive film having an upper surface lower than that of the hard mask.

6. The method of claim 1, wherein the conductive film comprises polysilicon.

7. The method of claim 1, wherein forming the patterned conductive film in the trench comprises using the hard mask as an end point detection film, and performing an over-etching operation after the hard mask is detected.

8. The method of claim 1, wherein removing the hard mask comprises etching the hard mask by using an etchant having an etching selectivity higher than that used for etching the conductive film.

9. The method of claim 1, further comprising forming a source area and a drain area on the semiconductor substrate adjacent both sides of the gate electrode.

10. The method of claim 1, wherein the hard mask comprises oxide and is formed directly on the semiconductor substrate.

* * * * *